US007697052B1

(12) United States Patent
Yamazaki et al.

(10) Patent No.: US 7,697,052 B1
(45) Date of Patent: Apr. 13, 2010

(54) ELECTRONIC VIEW FINDER UTILIZING AN ORGANIC ELECTROLUMINESCENCE DISPLAY

(75) Inventors: Shunpei Yamazaki, Tokyo (JP); Yu Yamazaki, Tokyo (JP); Keisuke Hayashi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/500,897

(22) Filed: Feb. 9, 2000

(30) Foreign Application Priority Data

Feb. 17, 1999 (JP) .................................. 11-038061

(51) Int. Cl.
*H04N 5/222* (2006.01)
*G09G 3/20* (2006.01)
*G09G 3/22* (2006.01)

(52) U.S. Cl. .................................... 348/333.01; 345/76
(58) Field of Classification Search ............ 348/333.01, 348/333.02, 333.03, 333.04, 333.05, 333.06, 348/333.07, 333.08, 333.09, 333.1, 333.11, 348/333.12, 333.13, 340, 800, 801; 396/373, 396/374, 375, 376, 377, 378, 379, 380, 381, 396/382, 383, 384, 385, 386; 349/69; 345/76, 345/77, 78, 79, 80, 81
See application file for complete search history.

(56) References Cited

U.S. PATENT DOCUMENTS

| | | | | |
|---|---|---|---|---|
| 2,986,599 A | * | 5/1961 | Kosche et. al. ......... | 348/333.08 |
| 4,330,797 A | * | 5/1982 | Yokokawa et al. ..... | 348/333.08 |
| 4,581,653 A | * | 4/1986 | Kaneda ...................... | 348/348 |
| 5,107,175 A | | 4/1992 | Hirano et al. ............... | 313/512 |
| 5,124,204 A | | 6/1992 | Yamashita et al. .......... | 428/331 |
| 5,168,384 A | * | 12/1992 | Genba ......................... | 349/58 |
| 5,189,405 A | | 2/1993 | Yamashita et al. .......... | 340/781 |
| 5,247,190 A | | 9/1993 | Friend et al. .................. | 257/40 |
| 5,399,502 A | | 3/1995 | Friend et al. .................... | 437/1 |
| 5,436,635 A | * | 7/1995 | Takahara et al. .............. | 345/92 |
| 5,517,278 A | * | 5/1996 | Takahara et al. ............ | 396/374 |
| 5,550,066 A | * | 8/1996 | Tang et al. ..................... | 438/29 |
| 5,652,930 A | * | 7/1997 | Teremy et al. .............. | 396/287 |
| 5,684,365 A | * | 11/1997 | Tang et al. ................ | 315/169.3 |
| 5,686,360 A | | 11/1997 | Harvey, III et al. .......... | 437/211 |
| 5,693,956 A | | 12/1997 | Shi et al. ....................... | 257/40 |
| 5,705,424 A | * | 1/1998 | Zavracky et al. .............. | 438/30 |
| 5,757,126 A | | 5/1998 | Harvey, III et al. .......... | 313/506 |
| 5,771,562 A | | 6/1998 | Harvey, III et al. ......... | 29/592.1 |
| 5,811,177 A | | 9/1998 | Shi et al. ..................... | 428/209 |

(Continued)

FOREIGN PATENT DOCUMENTS

JP      1-166018      6/1989

(Continued)

OTHER PUBLICATIONS

Schenk, H. et al, "Polymers for Light Emitting Diodes," *EuroDisplay '99, Proceedings of the 19th International Display Research Conference*, Berlin, Germany, Sep. 6-9, 1999, pp. 33-37. English abstract re Japanese patent application No. 10-092576 published Apr. 10, 1998.

*Primary Examiner*—Justin P Misleh
(74) *Attorney, Agent, or Firm*—Cook Alex Ltd.

(57) ABSTRACT

A view finder according to the present invention has an electroluminescence display element which displays an image of an object, and an optical element which magnifies the image.

20 Claims, 16 Drawing Sheets

U.S. PATENT DOCUMENTS

| | | | | |
|---|---|---|---|---|
| 5,952,778 | A | | 9/1999 | Haskal et al. ............... 313/504 |
| 6,046,547 | A | * | 4/2000 | Nishio et al. ............. 315/169.3 |
| 6,046,787 | A | * | 4/2000 | Nishiguchi .................. 349/129 |
| 6,075,581 | A | * | 6/2000 | Shirochi ..................... 349/112 |
| 6,114,715 | A | * | 9/2000 | Hamada ....................... 257/72 |
| 6,144,426 | A | | 11/2000 | Yamazaki et al. ............. 349/95 |
| 6,146,225 | A | | 11/2000 | Sheats et al. .................. 445/24 |
| 6,147,451 | A | * | 11/2000 | Shibata et al. ............... 313/506 |
| 6,150,187 | A | | 11/2000 | Zyung et al. .................. 438/26 |
| 6,175,345 | B1 | * | 1/2001 | Kuribayashi et al. .......... 345/76 |
| 6,198,217 | B1 | | 3/2001 | Suzuki et al. ............... 313/504 |
| 6,198,220 | B1 | | 3/2001 | Jones et al. ................. 313/512 |
| 6,215,244 | B1 | * | 4/2001 | Kuribayashi et al. ........ 313/505 |
| 6,215,462 | B1 | * | 4/2001 | Yamada et al. ................ 345/76 |
| 6,219,113 | B1 | * | 4/2001 | Takahara ..................... 349/42 |
| 6,239,470 | B1 | | 5/2001 | Yamazaki ................... 257/350 |
| 6,252,248 | B1 | | 6/2001 | Sano et al. |
| 6,278,132 | B1 | * | 8/2001 | Yamazaki et al. ............. 257/69 |
| 6,298,198 | B1 | * | 10/2001 | Ina et al. ...................... 396/54 |
| 6,388,652 | B1 | | 5/2002 | Yamazaki et al. |
| 6,407,785 | B1 | | 6/2002 | Yamazaki .................... 349/113 |
| 6,413,645 | B1 | | 7/2002 | Graff et al. .................. 428/446 |
| 6,441,468 | B1 | | 8/2002 | Yamazaki ................... 257/642 |
| 6,468,676 | B1 | * | 10/2002 | Ueda et al. .................. 428/690 |
| 6,535,228 | B1 | * | 3/2003 | Bandaru et al. ............. 345/752 |
| 6,548,144 | B1 | | 4/2003 | Teshima et al. ............. 428/138 |
| 6,593,626 | B2 | | 7/2003 | Hirabayashi et al. ........ 257/350 |
| 6,605,820 | B2 | | 8/2003 | Isoda et al. ................. 250/586 |
| 6,607,277 | B2 | | 8/2003 | Yokoyama et al. ............ 353/52 |
| 6,623,122 | B1 | | 9/2003 | Yamazaki et al. ............. 353/30 |
| 6,628,068 | B1 | | 9/2003 | Rorison et al. ............... 313/504 |
| 6,628,355 | B1 | * | 9/2003 | Takahara .................... 349/106 |
| 6,632,342 | B1 | | 10/2003 | Teshima et al. ............. 205/118 |
| 6,633,337 | B1 | * | 10/2003 | Togino .................. 348/333.08 |
| 6,642,913 | B1 | | 11/2003 | Kimura et al. ................. 345/84 |
| 6,664,071 | B1 | | 12/2003 | Windhab et al. ........... 435/7.94 |
| 6,671,014 | B2 | | 12/2003 | Yokoyama et al. ............ 349/65 |
| 6,678,023 | B1 | | 1/2004 | Yamazaki et al. ............. 349/95 |
| 6,710,870 | B1 | | 3/2004 | Marowsky et al. .......... 356/317 |
| 6,778,164 | B2 | | 8/2004 | Yamazaki et al. |
| 6,784,952 | B2 | | 8/2004 | Yamazaki ..................... 349/63 |
| 6,805,448 | B2 | | 10/2004 | Yokoyama et al. ............ 353/85 |
| 6,806,486 | B2 | | 10/2004 | Isoda et al. ................. 250/586 |
| 6,856,304 | B1 | | 2/2005 | Hirakata et al. ............... 345/32 |
| 6,876,147 | B2 | | 4/2005 | Utsumi ....................... 313/506 |
| 6,900,858 | B2 | | 5/2005 | Yokoyama et al. ............ 349/69 |
| 7,256,776 | B2 | | 8/2007 | Yamazaki et al. |
| 2002/0125817 | A1 | | 9/2002 | Yamazaki et al. ........... 313/498 |
| 2007/0291022 | A1 | | 12/2007 | Yamazaki et al. |

FOREIGN PATENT DOCUMENTS

| | | |
|---|---|---|
| JP | 04-125683 | 4/1992 |
| JP | 9-026602 | 1/1997 |
| JP | 9-211453 | 8/1997 |
| JP | 10-092576 | 4/1998 |
| JP | 10-260398 | 9/1998 |
| JP | 11-65471 | 3/1999 |
| JP | 11-84425 | 3/1999 |
| JP | 11-354802 | 12/1999 |
| WO | WO 90/13148 | 11/1990 |

\* cited by examiner

ELECTRONIC VIEW FINDER UTILIZING AN ORGANIC ELECTROLUMINESCENCE DISPLAY

BACKGROUND OF THE INVENTION

1. Field of the Invention

The present invention relates to a view finder and, more particularly, to a view finder used in a video camera or the like.

2. Description of the Related Art

Digital cameras and video cameras incorporating a CCD image pick-up element have recently been spreading as a result of a trend toward CCD image pick-up elements having higher resolution and smaller sizes. FIG. 8A is an external view of a conventional video camera.

2001 represents a video camera body; 2002 represents a liquid crystal panel; 2003 represents a view finder; 2004 and 2005 represent operating switches; and 2006 represents a lens. In the video camera shown in FIGS. 8A and 8B, an image taken in through the lens 2006 is converted by the CCD image-pick up element into an image signal which is in turn recorded on a recording medium. The liquid crystal panel 2002 and view finder 2003 are display devices for displaying the image signal.

As shown in FIG. 8B, a user 2100 can photograph an object while observing an image of the same displayed on the view finder 2003. FIG. 9 shows the conventional view finder 2003. 2100-1 represents either the left or right eye of the user 2100. The view finder 2003 has a small liquid crystal panel 2003-1, and the user can observe an image displayed on the small liquid crystal panel 2003-1.

In the case of the conventional view finder, an image on the view finder 2003 observed by a user 2100 is an image on the small liquid crystal panel 2003-1, and the image is therefore considerably hard to recognize because of its small size and low resolution. As a result, in practice, it has been difficult for a user 2100 to photograph an object while observing an image of the same on the view finder 2003.

Under such circumstances, conventional video cameras include an externally attached liquid crystal panel as represented by 2002 in FIG. 8A. Such a conventional external liquid crystal panel 2002 has a size in a range from about 2 to 4 inches which is larger relative to images observed on the view finder 2003 and which therefore provides a higher resolution. This allows a user 2100 to photograph an object and to reproduce a recorded image while observing an image of the same displayed on the external liquid crystal panel 2002.

However, the external liquid crystal panel 2002 consumes higher power than the small liquid crystal panel 2003-1 of the view finder 2003 does because the screen size of the same is greater than that of the small liquid crystal panel 2003-1 of the view finder 2003. When a video camera is used with such an external liquid crystal panel 2002 therefor in operation, the power consumption is about one and half times as much as that consumed when the external liquid crystal panel 2002 is not operated. Therefore, when a video camera is used with such an external liquid crystal panel 2002 operated, there is a significant influence on the durability of the battery which is one of the most serious problems with a video camera for which out-door usability and portability is important. It has not necessarily been advantageous for a user to use a video camera while checking the display on the external liquid crystal panel 2002.

FIG. 10 is an external view of a conventional digital camera. 3001 represents a digital camera body; 3002 represents a liquid crystal panel; 3003 represents a shutter button; and 3004 and 3005 represent operating switches. A user can take a picture while checking an image displayed on the liquid crystal panel 3002 and can reproduce a recorded image to check the same.

However, the trend toward liquid crystal panels having greater sizes and higher resolutions has resulted in an increase in the power consumption of liquid crystal panels, and this is a significant problem for digital cameras which are intended for out-door use like video cameras.

SUMMARY OF THE INVENTION

The present invention has been conceived taking the above-described problems into consideration, and it is an object of the invention to provide a view finder which consumes less power and which can present large images having a high resolution to users.

According to the invention, an image on a small display element (which is typically a liquid crystal panel) provided on a view finder can be magnified. A user can observe such a magnified image by observing the view finder. For example, a user can observe an image of 60 inches projected two meters ahead of him or her. According to the present invention, therefore, a user of a video camera can check a large image by observing a view finder without observing an external liquid crystal panel.

A view finder according to the invention may be used in various semiconductor apparatuses utilizing a view finder other than video cameras.

Configurations of view finders according to the invention will now be described.

A view finder according to the invention comprises:
a display element; and
an optical element for magnifying an image displayed on the display element.

A view finder according to the invention comprises:
a display element; and
a plurality of optical elements for magnifying an image displayed on the display element.

A view finder according to the invention comprises:
a display element; and
an optical element for magnifying an image displayed on the display element and projecting it upon an eye of a user.

A view finder according to the invention comprises:
a display element; and
a plurality of optical elements for magnifying an image displayed on the display element and projecting it upon an eye of a user.

The display element used in a view finder according to the invention may be a liquid crystal display element.

The display element used in a view finder according to the invention may be an organic EL display element.

DETAILED DESCRIPTION OF PREFERRED EMBODIMENTS

Figure 1:
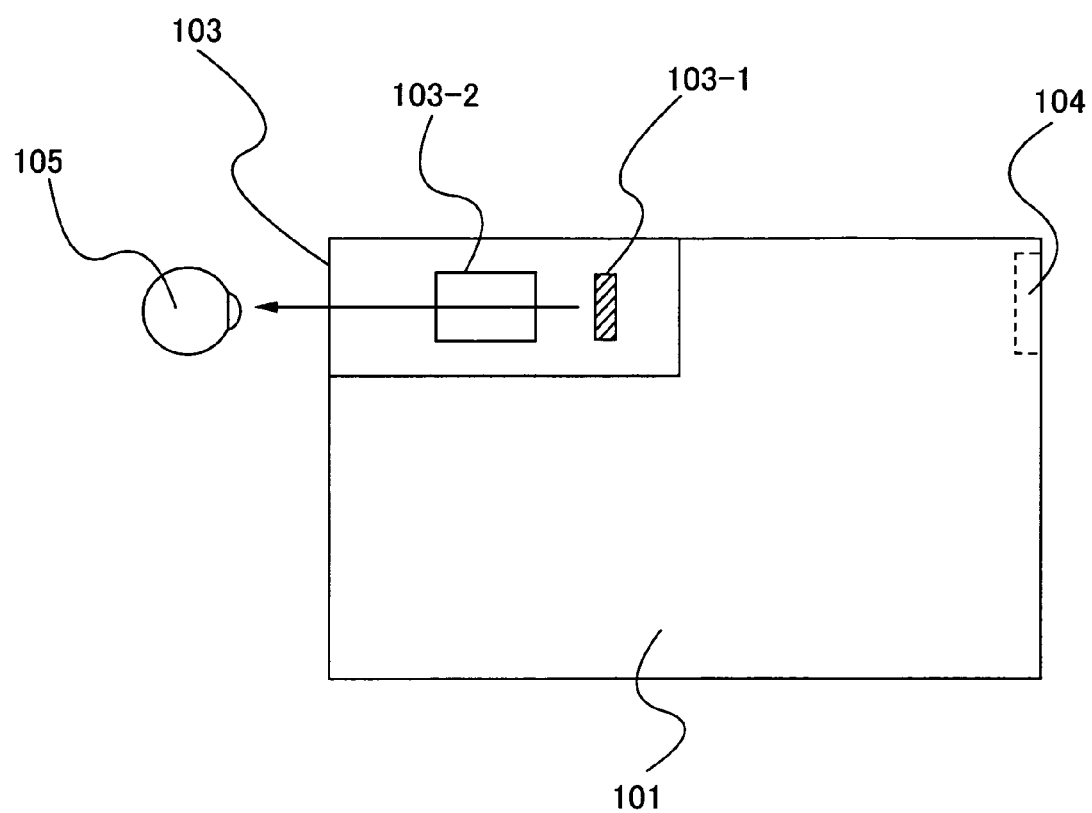
FIG. 1 is a schematic configuration diagram of a video camera having a view finder according to the invention.

Referring now to FIG. 1, FIG. 1 shows a view finder according to the invention incorporated in a video camera 101. 104 represents a lens. As shown in FIG. 1, a view finder 103 according to the invention has a display element 103-1 and an optical element 103-2. An image displayed on the display element 103-1 is magnified by the optical element 103-2 and is projected upon an eye 105 of a user to be recognized. This allows the user to check a large image by observing the view finder without observing an external liquid crystal panel, which is convenient for observation of an object.

Preferred embodiments of a view finder according to the invention will now be described. The view finder according to the invention is not limited to the following embodiments.

First Embodiment

Figure 2:
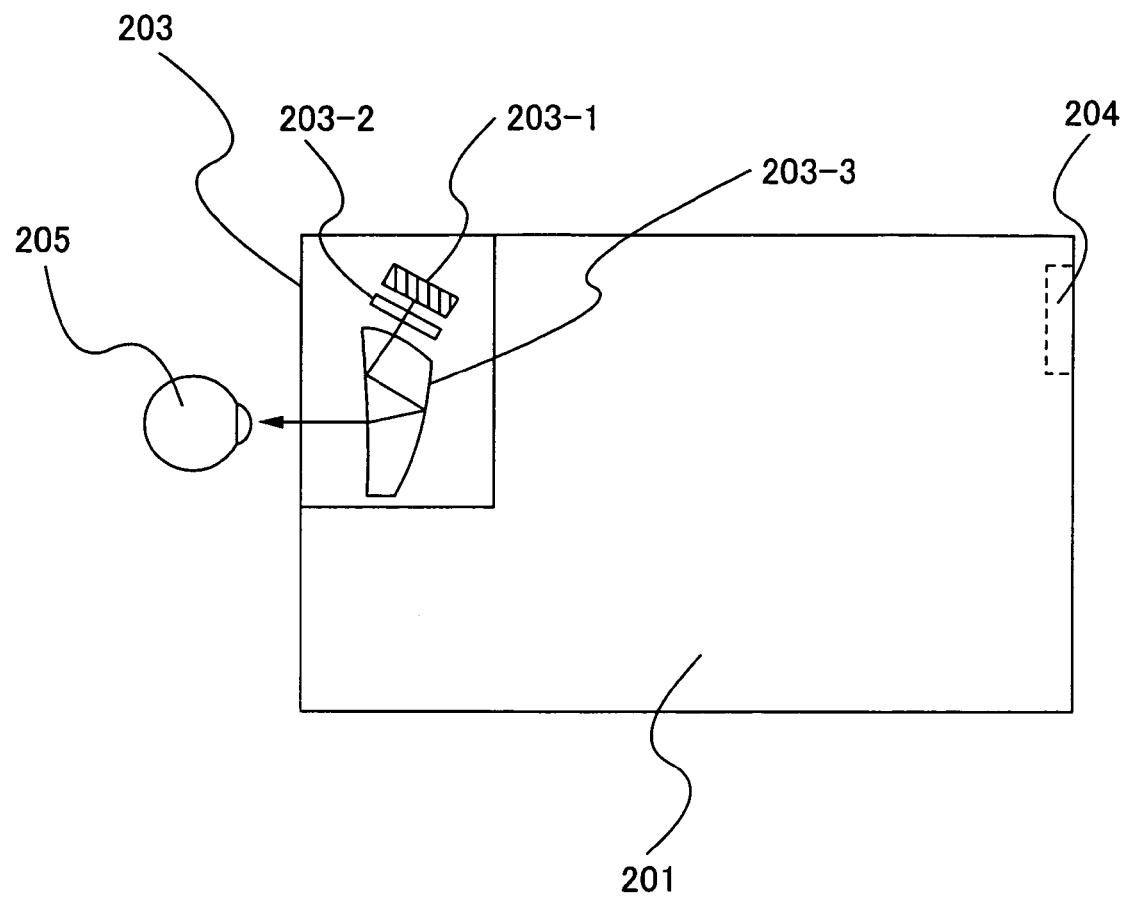
FIG. 2 is a schematic configuration diagram of a video camera having a view finder according to the invention.

Refer to FIG. 2. FIG. 2 shows a view finder 203 according to the present embodiment incorporated in a video camera 201. 204 represents a lens. As shown in FIG. 2, the view finder 203 according to the present embodiment has a display element 203-1 and optical elements 203-2 and 203-3. Light emitted by the display element 203-1 impinges upon the optical element 203-2 through the optical element 203-3. The light incident upon the optical element 203-2 is reflected by reflecting surfaces of the optical element 203-3 to exit from a transmitting surface thereof and to then exit from the view finder 203. A user of the video camera 201 recognizes a magnified image by observing the light exiting the view finder 203 according to the invention.

Light incident upon the optical element 203-3 used in the view finder 203 of the present embodiment is reflected twice by the reflecting surfaces to exit from the transmitting surface. With the view finder 203 of the present embodiment, an image displayed on the display element 203-1 is thus magnified by the optical elements 203-2 and 203-3 and is recognized by an eye 205 of a user. This allows the user to check a large image by observing the view finder 203 without observing an externally attached display device.

Typically, a liquid crystal panel is used as the display element of the view finder according to the present embodiment. The display mode of the liquid crystal display may be a twist nematic (TN) mode or field-controlled birefringent mode utilizing a nematic liquid crystal. The liquid crystal panel may be configured using a ferroelectric liquid crystal or antiferroelectric liquid crystal or a mixture of such liquid crystals. It is possible to use a ferroelectric liquid crystal that exhibits thresholdless response to an applied voltage or an antiferroelectric liquid crystal or a mixture of such liquid crystals.

Figure 11:
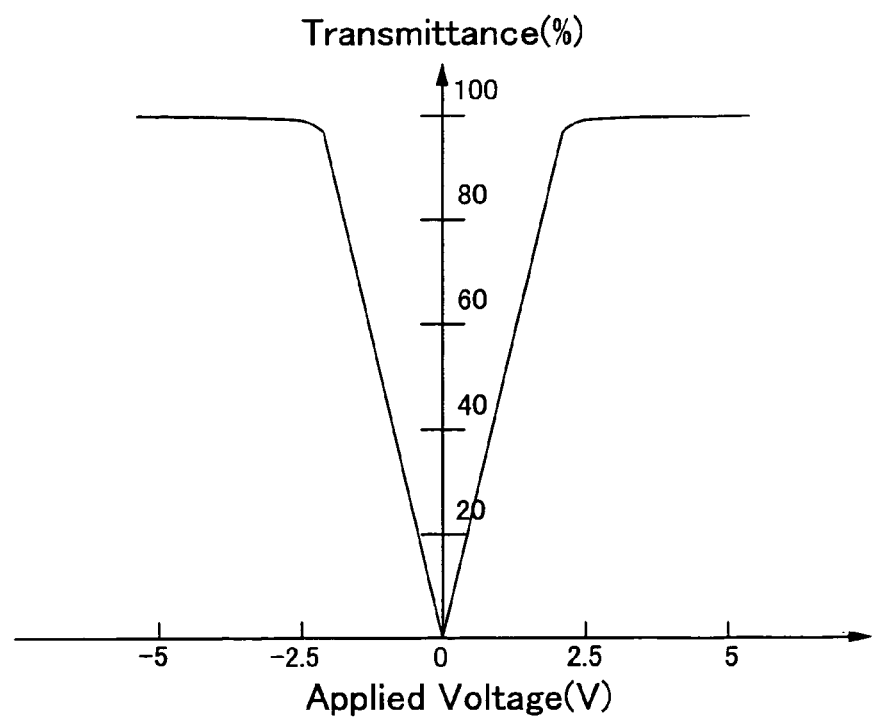
FIG. 11 is a graph showing an applied voltage—transmittance characteristic of a thresholdless antiferroelectric mixed liquid crystal.

FIG. 11 is a graph showing the characteristics of the optical transmittance of a thresholdless antiferroelectric mixed liquid crystal relative to an applied voltage. The polarizing axis of the entrance-side polarizing plate of the liquid crystal panel is set substantially in parallel with the normal direction of a smectic layer of a thresholdless antiferroelectric mixed liquid crystal that substantially agrees with the rubbing direction of the liquid crystal panel. The polarizing axis of the exit side polarizing plate is set substantially perpendicular (cross Nicol) to the polarizing axis of the entrance side polarizing plate. Thus, the use of a thresholdless antiferroelectric mixed liquid crystal allows gray scale representation that exhibits an applied voltage-transmittance characteristic as shown in FIG. 11.

In general, a thresholdless antiferroelectric mixed liquid crystal has significant spontaneous polarization, and the liquid crystal itself has a high dielectric constant. Therefore, when a thresholdless antiferroelectric mixed liquid crystal is used for a liquid crystal display device, a pixel must have a relatively large storage capacity. It is therefore preferable to use a thresholdless antiferroelectric mixed liquid crystal that exhibits less spontaneous polarization. Line sequential driving of a liquid crystal panel makes it possible to increase the time for writing a gray scale voltage to a pixel (pixel field period), which allows even a small storage capacity to be compensated.

The use of a thresholdless antiferroelectric liquid crystal allows a reduction in the power consumption of the liquid crystal display device because driving can be performed at a low voltage.

Figure 3A:
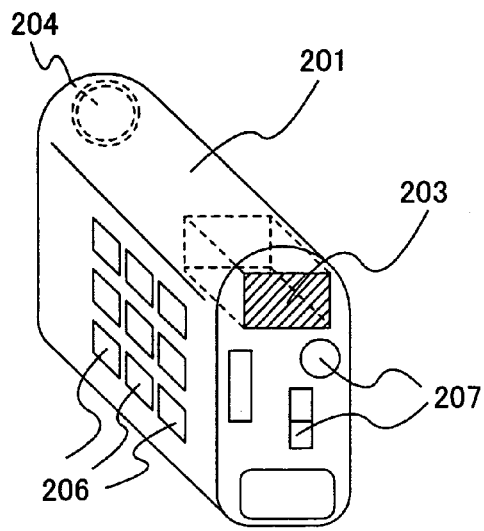
FIGS. 3A, 3B and 3C are perspective views of video cameras having a view finder according to the invention.
Figure 3B:
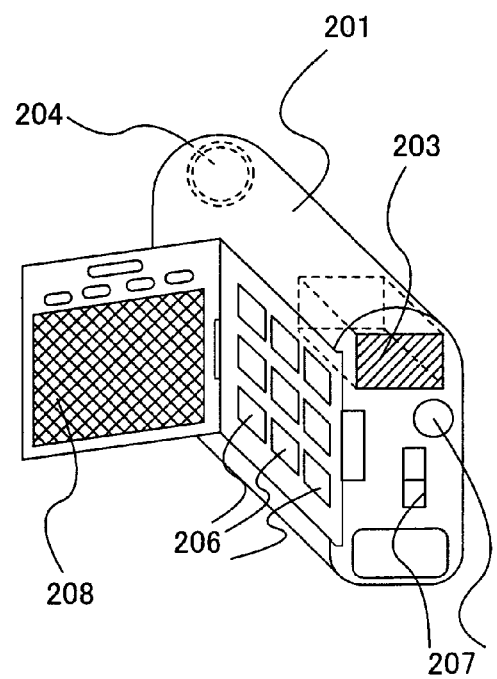
Figure 3C:
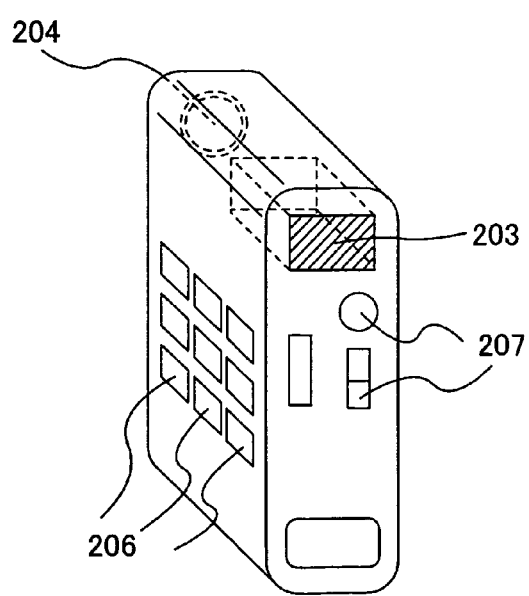

FIGS. 3A, 3B and 3C show examples of video cameras utilizing a view finder 203 according to the present embodiment. In FIGS. 3A, 3B and 3C, 201 represents a video camera body; 203 represents a view finder according to the present embodiment; 204 represents a lens; and 206 and 207 represent operating switches. FIG. 3B shows a video camera having an externally attached liquid crystal panel 208. The video camera bodies of the video cameras shown in FIGS. 3A and 3B have different configurations and sizes.

A view finder according to the present embodiment may be used even in a video camera having an external liquid crystal panel like the video camera shown in FIG. 3B. In this case, a magnified image can be observed by observing the view finder 203 without operating the external liquid crystal panel 208. The view finder according to the embodiment is therefore quite convenient when the video camera must be battery-operated as in the case of out-door use.

Second Embodiment

Figure 4:
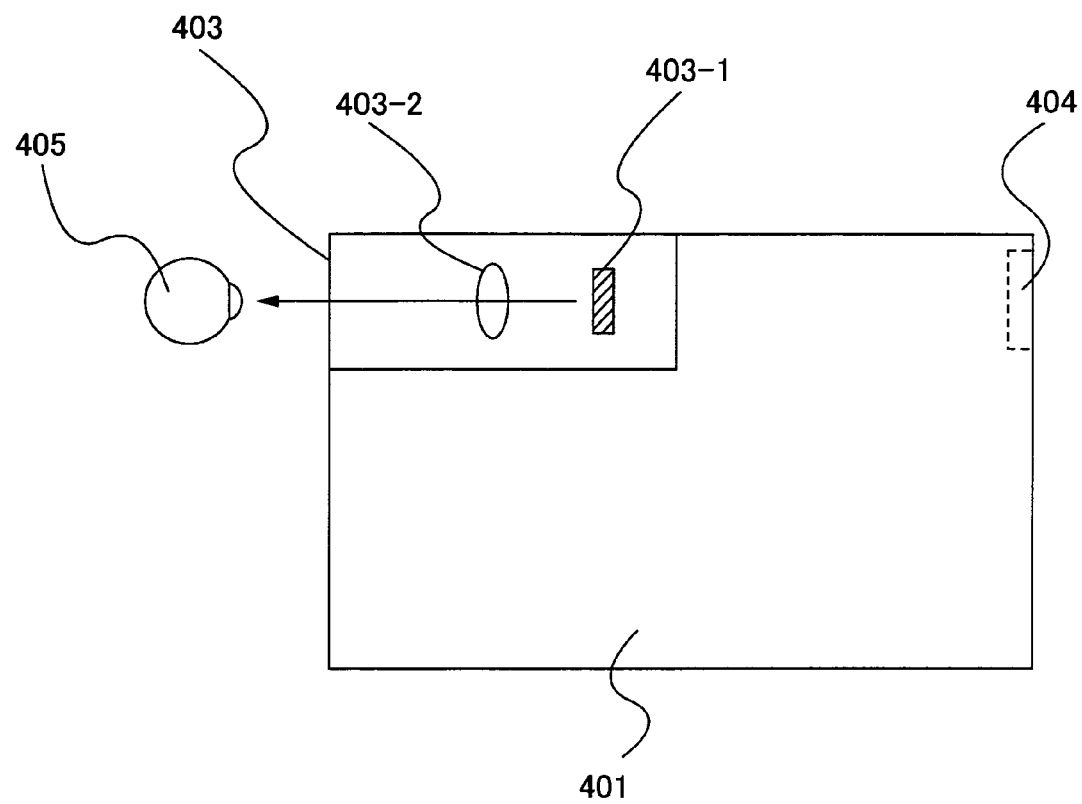
FIG. 4 is a schematic configuration diagram of a video camera having a view finder according to the invention.

Refer to FIG. 4. FIG. 4 shows a view finder according to the present embodiment incorporated in a video camera 401. 404 represents a lens. As shown in FIG. 4, a view finder 403 according the present invention has a display element 403-1 and an optical element 403-2. The optical element 403-2 is an optical element such as a lens. Light emitted by the display element 403-1 impinges upon the optical element 403-3 to be magnified and emitted from the view finder 403. A user of the video camera 401 recognizes the magnified image by observing light exiting from the view finder 403 according to the invention.

With the view finder 403 of the present embodiment, an image displayed on the display element 403-1 is thus magnified by the optical element 403-2 and recognized by an eye 405 of a user. This allows the user to check a magnified image by observing the view finder 403 without observing an external display device.

A display element as described in the first embodiment is used as the display element 403-1 according to the present embodiment. The video cameras shown in FIGS. 3A, 3B and 3C and described in the first embodiment are examples of video cameras utilizing a view finder according to the present embodiment.

Third Embodiment

Figure 5:
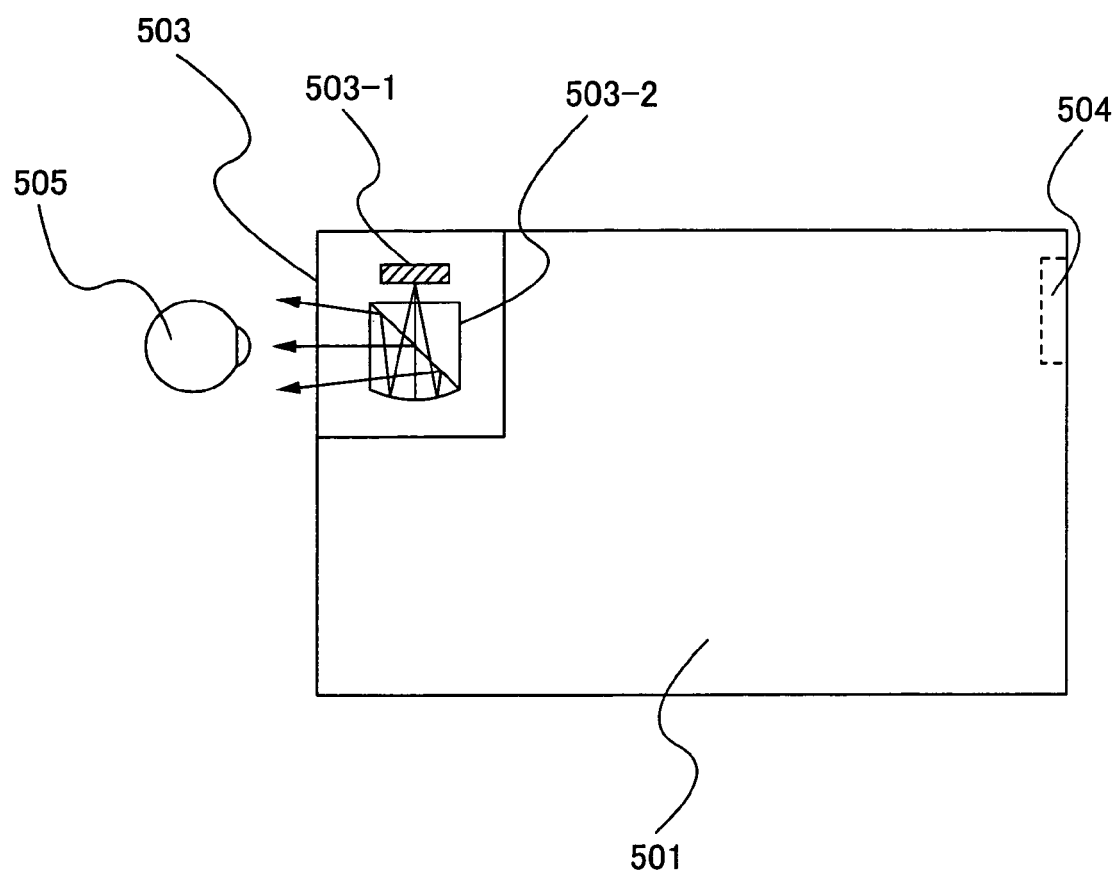
FIG. 5 is a schematic configuration diagram of a video camera having a view finder according to the invention.

Refer to FIG. 5. FIG. 5 shows a view finder according to the present embodiment incorporated in a video camera 501. 504 represents a lens. As shown in FIG. 5, a view finder 503 according to the present embodiment has a display element 503-1 and an optical element 503-2. Light emitted by the display element 503-1 impinges upon the optical element 503-2. The light incident upon the optical element 503-2 is reflected by reflecting surfaces of the optical element 503-2 to exit from a transmitting surface thereof and to then exit from the view finder 503. A user of the video camera 501 recognizes a magnified image by observing the light exiting the view finder 503 according to the invention.

With the view finder 503 of the present embodiment, an image displayed on the display element 503-1 is thus magnified by the optical element 503-2 and recognized by an eye 505 of a user. This allows the user to check a magnified image by observing the view finder 503 without observing an external display device.

A display element as described in the first embodiment is used as the display element 503-1 according to the present embodiment. The video cameras shown in FIGS. 3A, 3B and 3C and described in the first embodiment are examples of video cameras utilizing a view finder according to the present embodiment.

Fourth Embodiment

The present embodiment will refer to the use of a view finder according to the invention described in any of the first, second and third embodiments in a digital camera.

Figure 6:
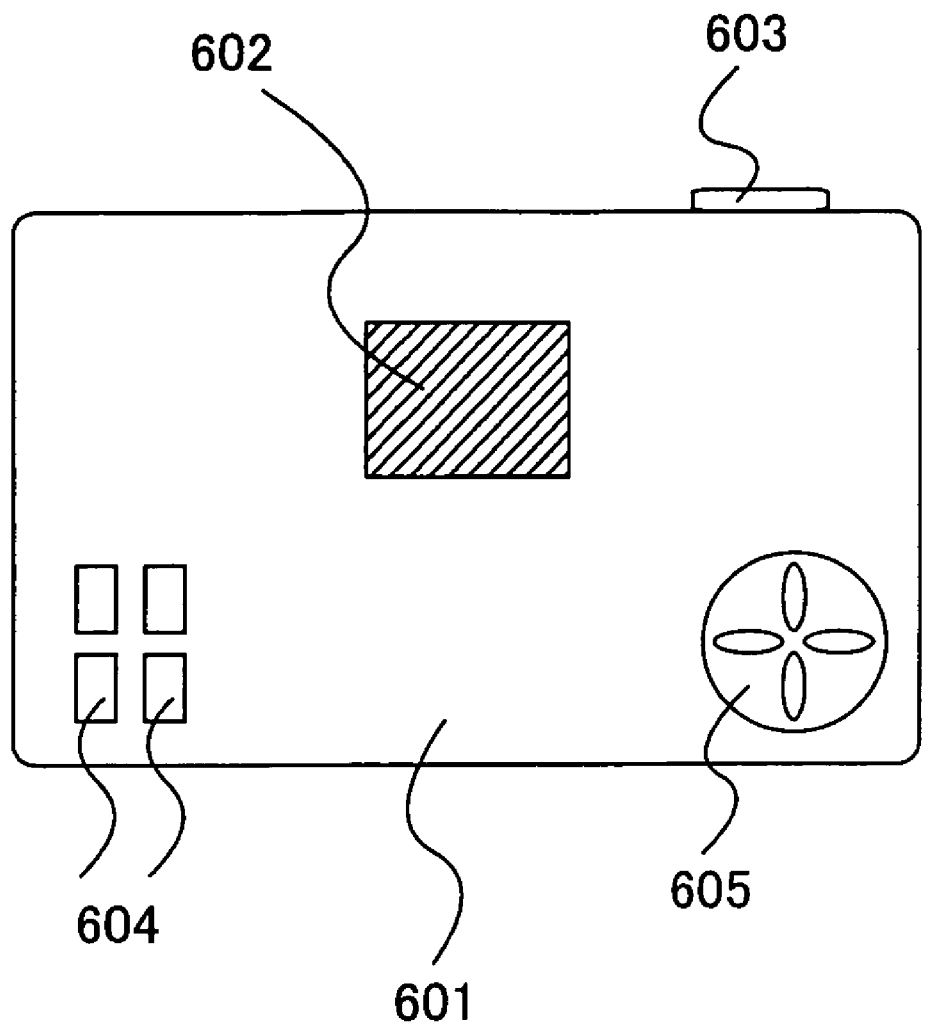
FIG. 6 is a schematic configuration diagram of a digital camera having a view finder according to the invention.

Refer to FIG. 6. FIG. 6 shows a digital camera incorporating a view finder according to the invention described in any of the first, second and third embodiments. 601 represents a digital camera body; 602 represents a view finder according to the invention; 603 represents a shutter button; and 604 and 605 represent operating switches.

The digital camera 601 according to the present embodiment allows a user observing the view finder 602 to check a magnified image because it incorporates the view finder 602 according to the invention. This is very convenient for photographing and reproduction of an image with the digital camera.

Fifth Embodiment

Figure 7A:
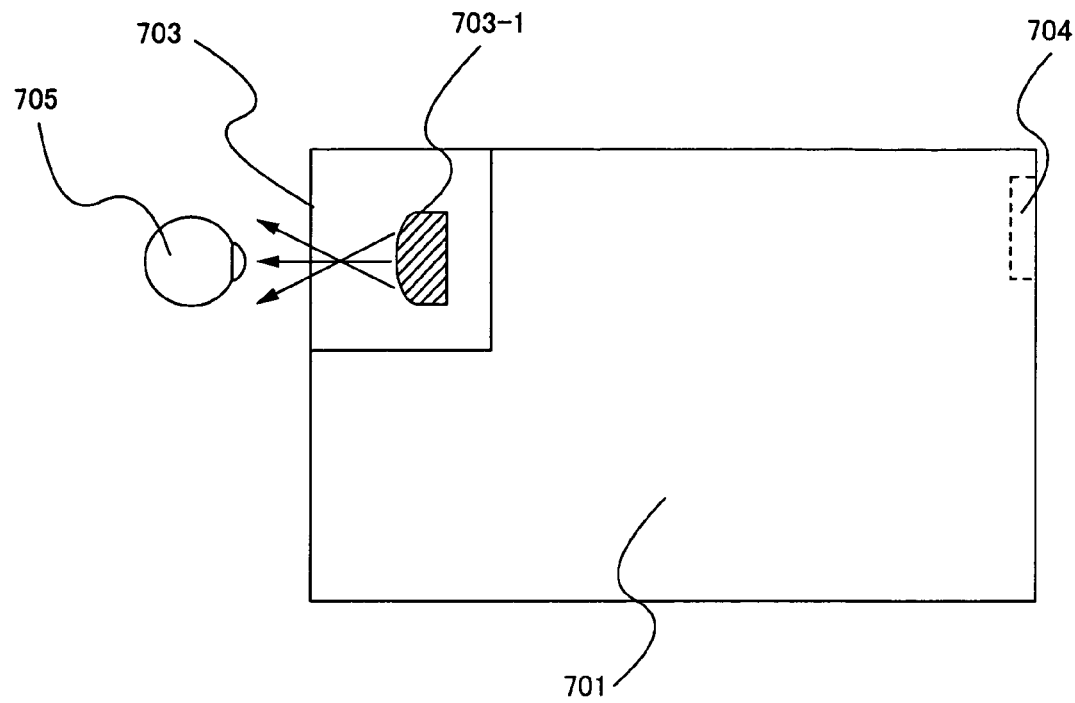
FIGS. 7A and 7B are schematic configuration diagrams of a video camera having a view finder according to the invention.
Figure 7B:
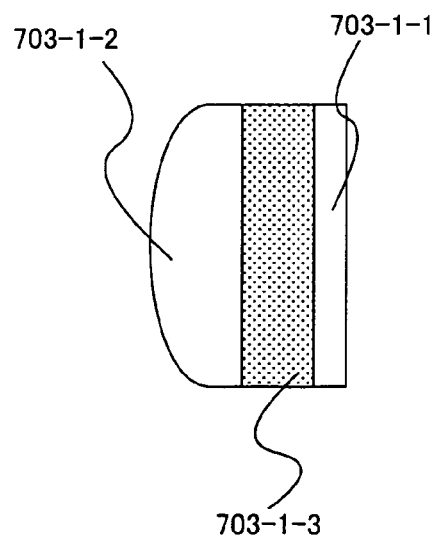
Figure 8A:
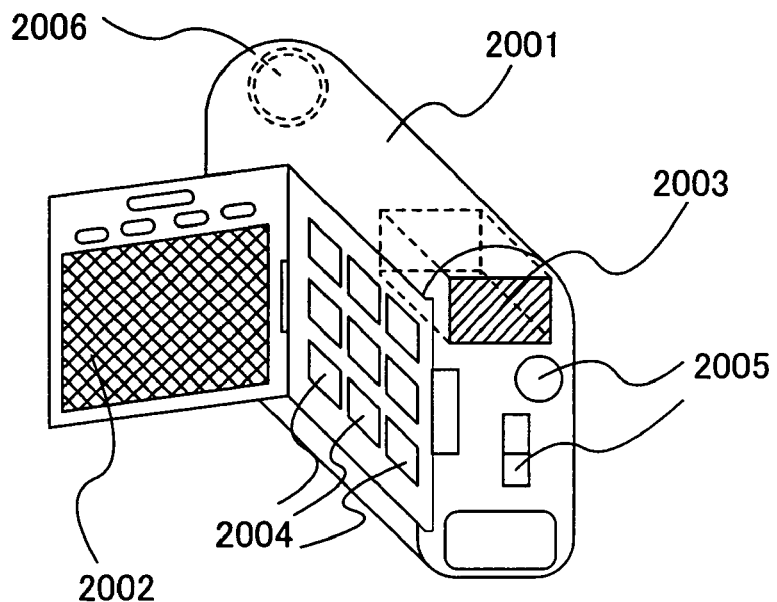
FIG. 8A is a perspective view of a conventional video camera.
Figure 8B:
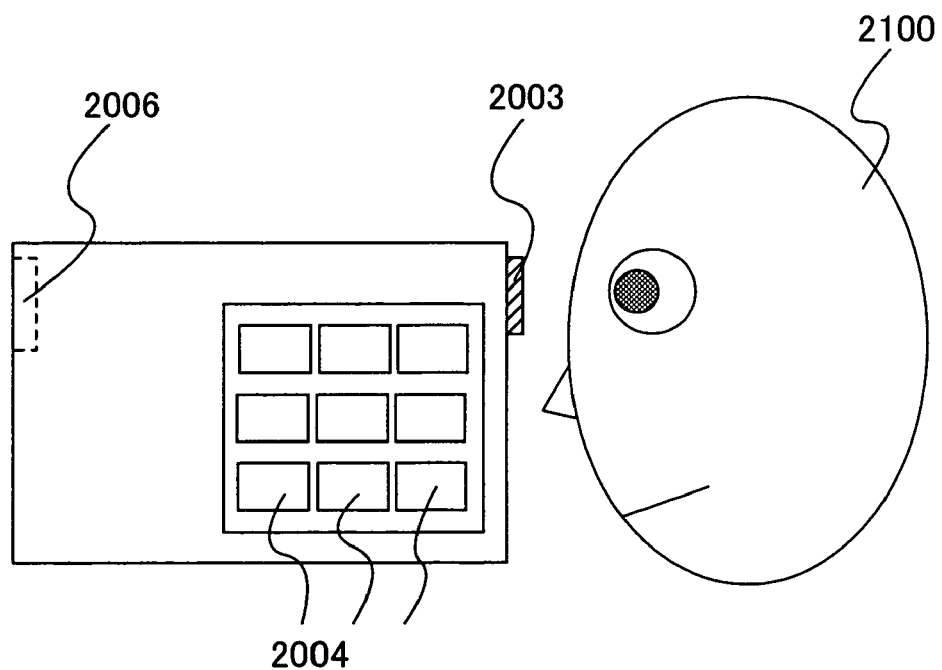
FIG. 8B is a scene that a user is observing an image on the view finder in the conventional video camera.
Figure 9:
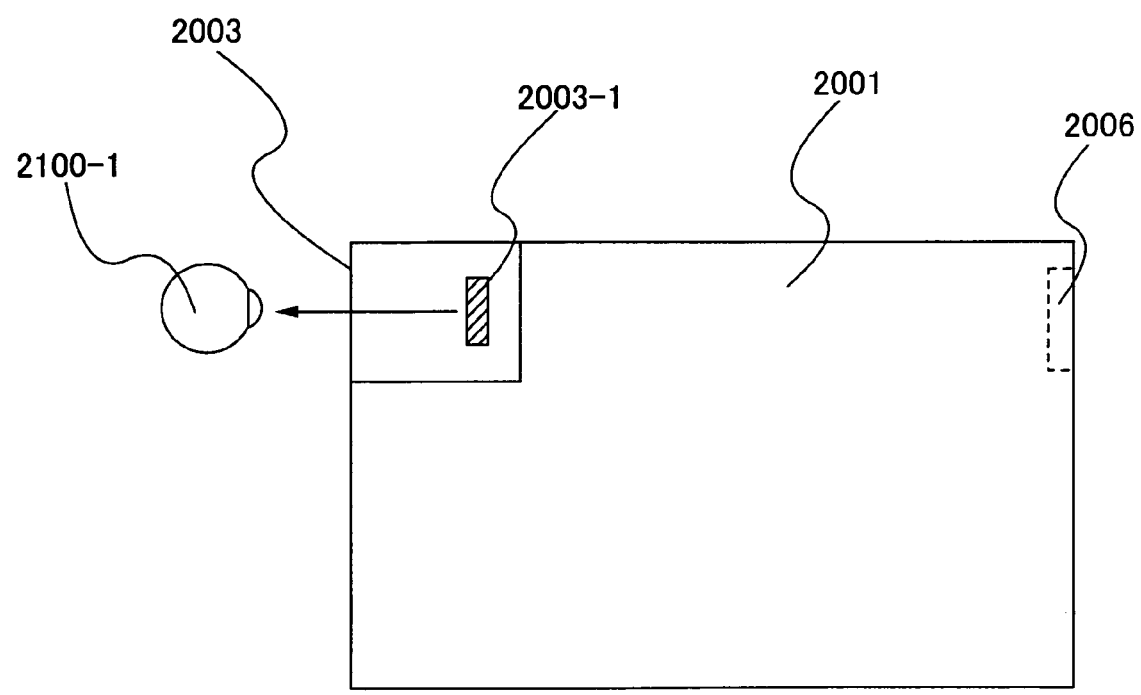
FIG. 9 is a schematic configuration diagram of a video camera having a conventional view finder.
Figure 10:
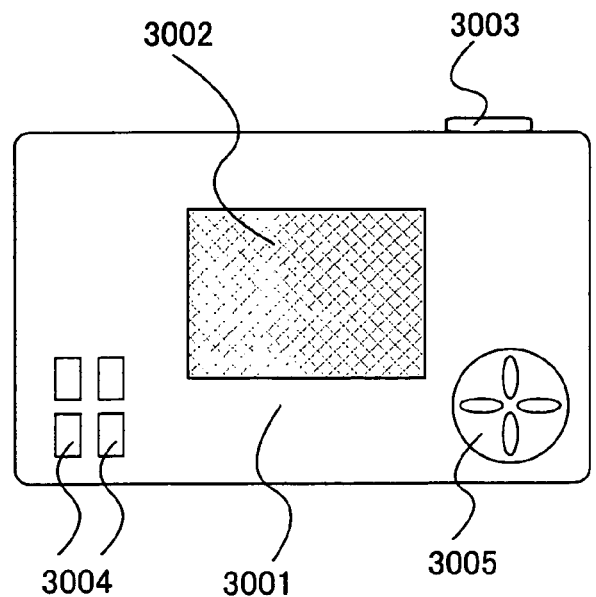
FIG. 10 is an external view of a conventional digital camera.

Refer to FIGS. 7A and 7B. FIG. 7A shows a view finder according to the present embodiment incorporated in a video camera 701. 704 represents a lens. The view finder 703 of the present embodiment has a display element 703-1. FIG. 7B is an enlarged view of the display element 703-1. The display element 703-1 of the present embodiment has a substrate 703-1-1, a substrate 703-1-2 and a display medium 703-1-3. In the present embodiment, a liquid crystal is used as the display medium 703-1-3. The surface of one of the substrates 703-1-2 of the display element 703-1 on the light emitting side thereof has a spherical configuration and acts as a lens. Light from the display element 703-1 exits from the view finder 703. A user of the video camera 701 recognizes a magnified image by observing the light exiting from the view finder 703 according to the invention.

With the view finder 703 of the present embodiment, an image displayed on the display element 703-1 is thus magnified and recognized by an eye 705 of a user. This allows the user to check a magnified image by observing the view finder 703 without observing an external display device.

A display element as described in the first embodiment is used as the display element 703-1 according to the present embodiment. The cameras shown in FIGS. 3A, 3B and 3C and described in the first or fourth embodiment are examples of video cameras and digital cameras utilizing a view finder according to the present embodiment.

Sixth Embodiment

The present embodiment will refer to an example of the fabrication of an EL (electroluminescence) display device as a display device of a view finder according to the invention.

Figure 12A:
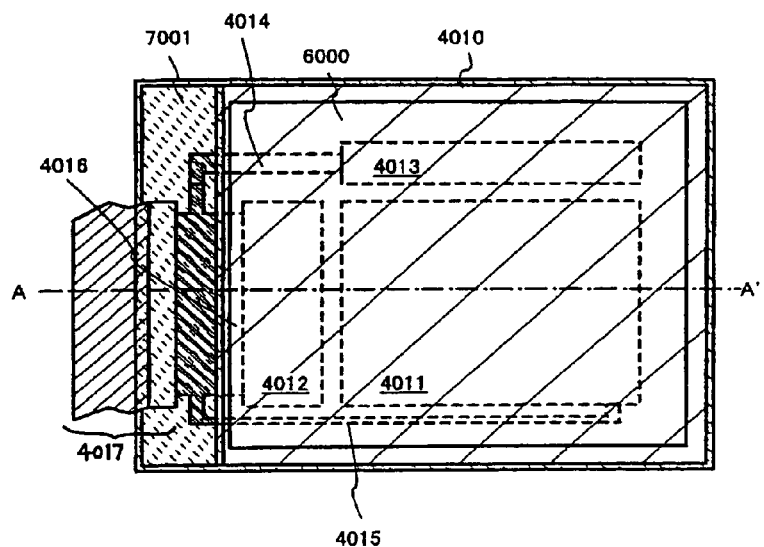
FIGS. 12A and 12B illustrate a configuration of an EL display device according to a sixth embodiment of the invention.

FIG. 12A is a plan view of an EL display device according to the present embodiment. In FIG. 12A, 4010 represents a substrate; 4011 represents a pixel portion; 4012 represents a source-side driving circuit; and 4013 represents a gate-side driving circuit. Also, 6000 represents a cover member, and 7001 represents a seal member. Each of the driving circuits is connected to an FPC 4017 through lines 4014 through 4016 and is connected to an external apparatus.

Figure 12B:
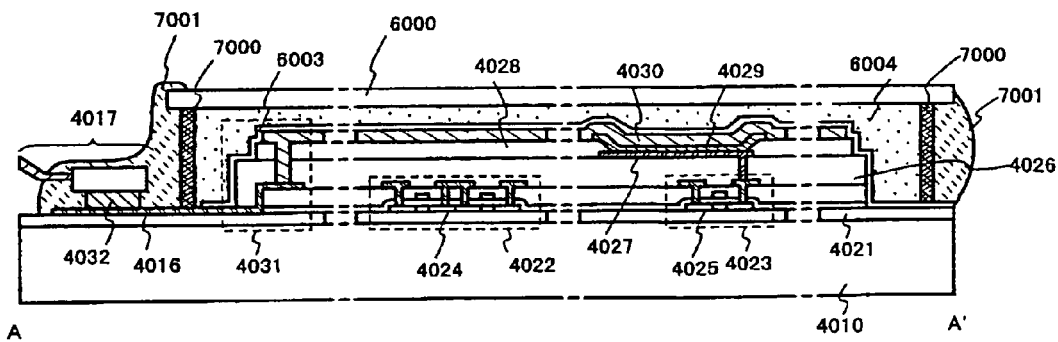

FIG. 12B shows a sectional structure of the EL display device of the present embodiment. A cover member 6000, a seal member 7000 and a hermetic member (a second seal member) 7001 are provided to enclose at least the pixel portion and, preferably, the driving circuits and pixel portion.

TFTs 4022 for the diving circuits (a CMOS circuit which is a combination of an n-channel type TFT and a p-channel type TFT is shown here) and a TFT 4023 for the pixel portion (only a TFT for controlling a current supplied to the EL element is shown here) are formed on the substrate 4010 and an underlying film 4021.

When the driving circuit TFTs 4022 and the pixel portion TFT 4023 are completed, a pixel electrode 4027 constituted by a transparent conductive film electrically connected to the drain of the pixel portion 4023 is formed on a layer insulation film (planarizing film) 4026 made of a resin material. A compound of indium oxide and tin oxide (referred to as "ITO") or a compound of indium oxide and zinc oxide may be used as the transparent conductive film. After the pixel electrode 4027 is formed, an insulation film 4028 is formed, and an opening is formed over the pixel electrode 4027.

Next, an EL layer 4029 is formed. The EL layer 4029 may be formed in a multi-layer structure or single-layer structure from an arbitrary combination of known EL materials (hole injection layer, hole transport layer, emission layer, electron transport layer or electron injection layer). The structure may be obtained using known techniques. The EL materials include low molecular type materials and high molecular type (polymer type) materials. While a vapor deposition process is used for a low molecular type material, a simpler method such as a spin coating process, printing process or inkjet process may be used for a high molecular type material.

According to the present embodiment, the EL layer is formed through a vapor deposition process using a shadow mask. Color representation can be performed by forming emission layers (a red emission layer, green emission layer and blue emission layer) from which light having a different wavelength can be emitted at each pixel using a shadow mask. Any of other methods may be used, including a method in which a color conversion layer (CCM) and a color filter are combined and a method in which a white emission layer and a color filter are combined. Obviously, an EL display device of monochromatic emission may be provided.

After the EL layer 4029 is formed, a cathode 4030 is formed thereon. The presence of moisture or oxygen at the interface between the cathode 4030 and the EL layer 4029 is preferably minimized. Therefore, measures must be taken including the continuous formation of the EL layer 4029 and cathode 4030 in vacuum and the formation of the EL layer 4029 in an inert atmosphere and the formation of the cathode 4030 without exposing it to the atmosphere. According to the present embodiment, such film formation is realized by using a multi-chamber type (cluster tool type) film forming apparatus.

According to the present embodiment, a multi-layer structure constituted by a LiF (lithium fluoride) film and an Al (aluminum) film is used as the cathode 4030. Specifically, a LiF (lithium fluoride) film having a thickness of 1 nm is formed on the EL layer 4029 using a vapor deposition process, and an aluminum film having a thickness of 300 nm is formed on the same. A MgAg electrode which is a well-known cathode material may obviously be used. The cathode 4030 is connected to the line 4016 in a region thereof represented by 4031. The line 4016 is a power supply line for applying a predetermined voltage to the cathode 4030 and is connected to the FPC 4017 through a conductive paste material 4032.

In order to electrically connect the cathode 4030 and line 4016 in the region represented by 4031, contact holes must be formed in the layer insulation film 4026 and insulation film 4028. They may be formed when the layer insulation film 4026 is etched (when a contact hole for the pixel electrode is formed) or when the insulation film 4028 is etched (when the opening is formed prior to the formation of the EL layer). Alternatively, the layer insulation film 4026 is etched at the same time when the insulation film 4028 is etched. In this case, the contact holes can be formed with a preferable configuration if the layer insulation film 4026 and insulation film 4028 are made of the same resin material.

A passivation film 6003, a filler 6004 and a cover member 6000 are formed such that they cover the EL element thus formed.

Further, a seal member 7000 is provided inside the cover member 6000 and substrate 4010 such that it surrounds the EL element portion, and a hermetic member (second sealing member) 7001 is formed outside the seal member 7000.

The filler 6004 also serves as an adhesive to bond the cover member 6000. PVC (polyvinyl chloride), epoxy resin, silicone resin, PVB (polyvinyl butyral) or EVA (ethylene vinyl acetate) may be used as the filler 6004. A drying agent is preferably provided within the filler 6004 because it will maintain a moisture absorbing effect.

Spacers may be included in the filler 6004. The spacers may be a granular substance made of BaO or the like, which provides the spacers themselves with moisture absorbing properties.

When spacers are provided, the pressure of the spacers can be mitigated by the passivation film 6003. A resin film may be provided in addition to the passivation film 6003 to mitigate the pressure of the spacers.

A glass plate, aluminum plate, stainless steel plate, FRP (fiberglass-reinforced plastics) plate, PVF (polyvinyl fluoride) film, Mylar film, polyester film or acrylic film may be used as the cover member 6000. When PVB or EVA is used as the filler 6000, it is preferable to use a sheet having a structure in which an aluminum foil of several tens um is sandwiched by PVF films or Mylar films.

Provided, the cover member 6000 must be transmissible depending on the light-emitting direction (direction of radiation light) of the EL element.

The line 4016 is routed through a gap that the seal member 7000 and hermetic member 7001 define with the substrate 4010 to be electrically connected to the FPC 4017. While the line 4016 has been described here, the remaining lines 4014 and 4015 are similarly routed under the seal member 7000 and hermetic member 7001 to be electrically connected to the FPC 4017.

Seventh Embodiment

Figure 13A:
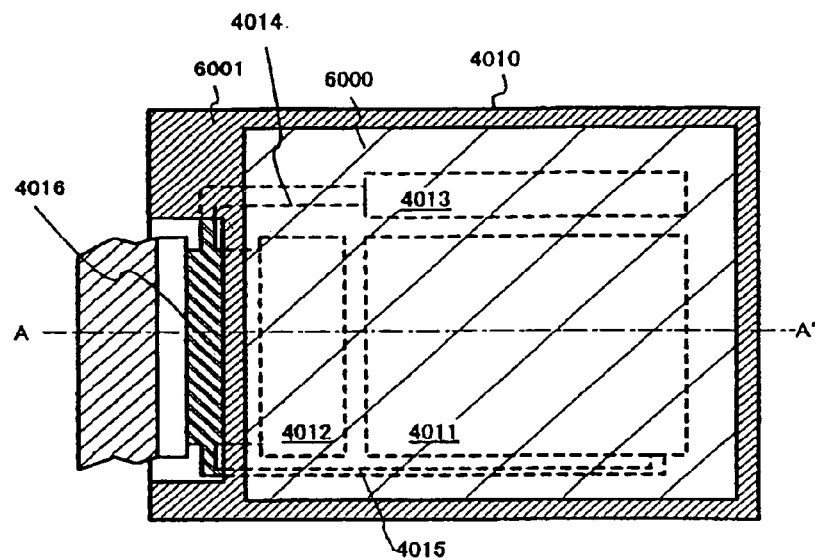
FIGS. 13A and 13B illustrate a configuration of an EL display device according to a seventh embodiment of the invention.
Figure 13B:
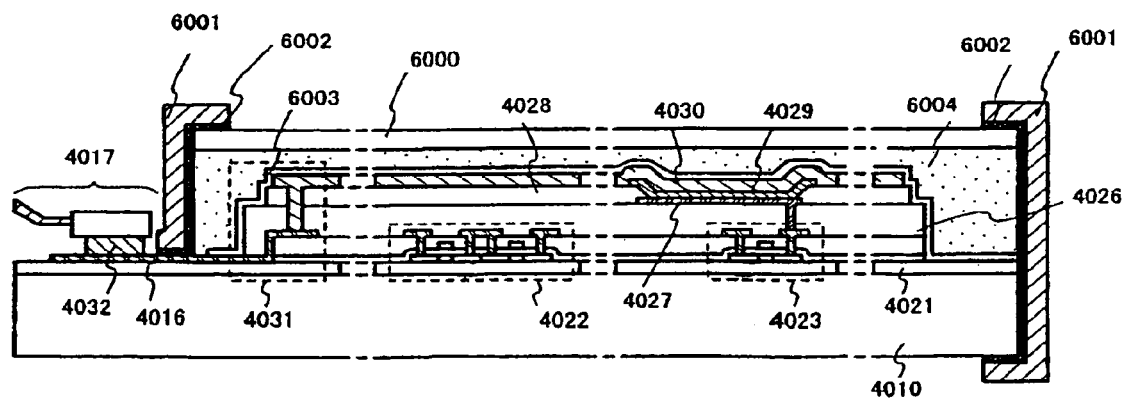

The present embodiment will refer to an example of the fabrication of an EL display device having a configuration different from that of the sixth embodiment with reference to FIGS. 13A and 13B. Like reference numbers in FIGS. 13A and 13B indicate like parts which will not be described repeatedly.

FIG. 13A is a plan view of the EL display device of the present embodiment, and FIG. 13B is a sectional view taken along the line A-A' in FIG. 13A.

According to the sixth embodiment, processes up to the formation of the passivation film 6003 are carried put to cover the surface of an EL element.

Further, the filler 6004 is provided to cover the EL element. The filler 6004 also serves as an adhesive to bond the cover member 6000. PVC (polyvinyl chloride), epoxy resin, silicone resin, PVB (polyvinyl butyral) or EVA (ethylene vinyl acetate) may be used as the filler 6004. A drying agent is preferably provided within the filler 6004 because it will maintain a moisture absorbing effect.

Spacers may be included in the filler 6004. The spacers may be a granular substance made of BaO or the like, which provides the spacers themselves with moisture absorbing properties.

When spacers are provided, the pressure of the spacers can be mitigated by the passivation film 6003. A resin film may be provided in addition to the passivation film 6003 to mitigate the pressure of the spacers.

A glass plate, aluminum plate, stainless steel plate, FRP (fiberglass-reinforced plastics) plate, PVF (polyvinyl fluoride) film, Mylar film, polyester film or acrylic film may be used as the cover member 6000. When PVB or EVA is used as the filler 6004, it is preferable to use a sheet having a structure in which an aluminum foil of several tens um is sandwiched by PVF films or Mylar films.

The cover member 6000 must be transmissible depending on the light-emitting direction (direction of radiation of light) of the EL element.

After the cover member 6000 is bonded using the filler 6004, frame members 6001 are attached to cover lateral surfaces (exposed surfaces) of the filler 6004. The frame members 6001 are bonded with the seal member (acting as an adhesive) 6002. While photo-setting resin is preferably used as the seal member 6002, thermo-setting resin may be used as long as acceptable with respect to the anti-heat properties of the EL layer. The seal member 6002 is preferably made of a material that exhibits minimum permeability against moisture and oxygen. Further, the drying agent is preferably added within the seal member 6002.

The line 4016 is routed through a gap between the seal member 6002 and the substrate 4010 to be electrically connected to the FPC 4017. While the line 4016 has been described here, the remaining lines 4014 and 4015 are similarly routed under the seal member 6002 to be electrically connected to the FPC 4017.

Eighth Embodiment

Figure 14:
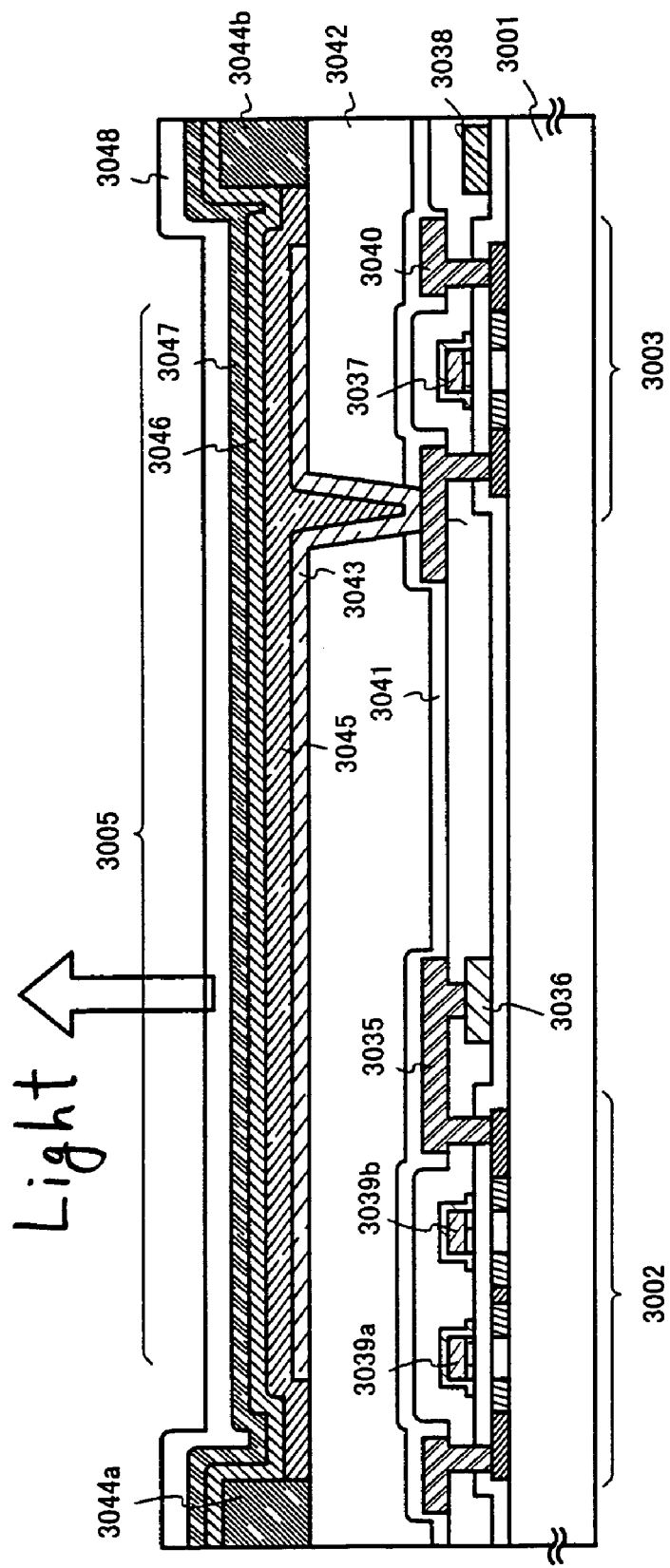
FIG. 14 is a sectional view of an EL display device according to an eighth embodiment of the invention showing a configuration of a pixel portion thereof.
Figure 15A:
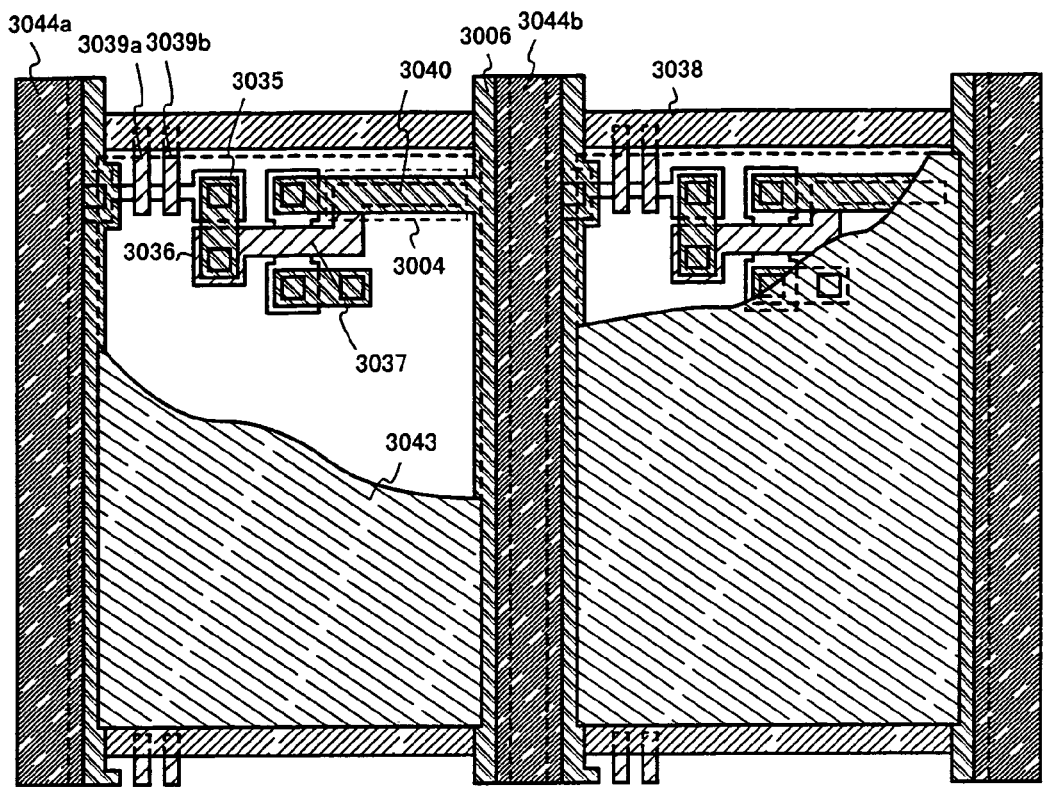
FIGS. 15A and 15B are a plan view and a circuit diagram of the EL display device according to the eighth embodiment showing a configuration of the pixel portion thereof.
Figure 15B:
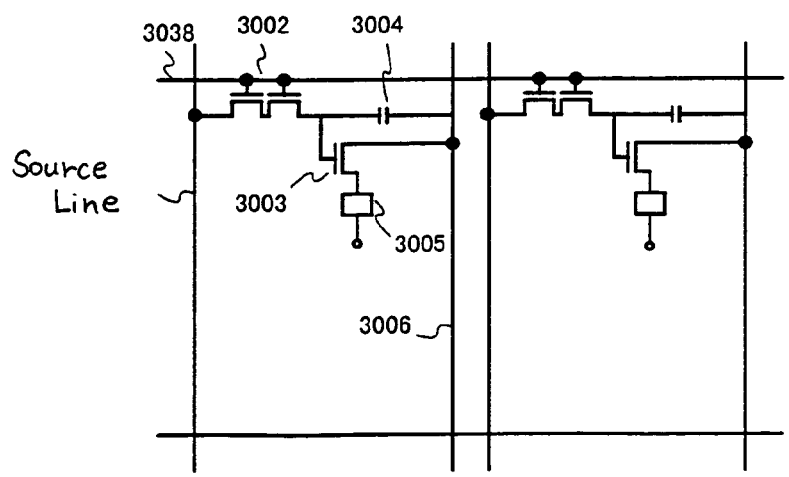

According to the present embodiment, FIG. 14 shows a more detailed sectional structure of a pixel portion of an EL display panel, and FIG. 15A shows a structure thereof as viewed from above. FIGS. 14, 15A and 15B use common reference numbers to allow cross reference between them.

Referring to FIG. 14, a switching TFT 3002 provided on a substrate 3001 may have the TFT structure according to the sixth and seventh embodiments and may alternatively have any other known TFT structure. The present embodiment employs a double-gate structure which will not be described here because it does not result in any significant difference in the structure and fabrication process of the device. However, the double-gate structure is advantageous in that the off-current can be reduced because substantially two TFTs are connected in series in the same structure. While the present embodiment employs a double-gate structure, single-gate structure may be used and, in addition, a triple-gate structure or a multi-gate structure having a greater number of gates may alternatively be used.

A current control TFT 3003 is formed using an N-TFT. A drain line 3035 of the switching TFT 3002 is electrically connected to a gate electrode 3037 of the current control TFT by a line 3036. The line represented by 3038 is a gate line for electrically connecting gate electrodes 3039a and 3039b of the switching TFT 3002.

Since the current control TFT is an element for controlling the quantity of the current flowing through the EL element, it may be also regarded as an element which is subjected to high risk of deterioration due to heat or hot carriers because of a high current that flows therethrough. For this reason, the structure is quite advantageous in that an LDD region is provided at the drain-side of the current control TFT such that it overlaps the gate electrode with a gate insulation film interposed therebetween.

While the current control TFT 3003 of the present embodiment is illustrated as having a single-gate structure, it may have a multi-gate structure in which a plurality of TFTs are connected in series. Further, a structure may be employed in which a plurality of TFTs are connected in parallel to substantially provide a plurality of separate channel forming regions that allow radiation of heat with high efficiency. Such a structure is advantageous as a countermeasure against deterioration due to heat.

As shown in FIG. 15A, the line to serve as the gate electrode 3037 of the current control TFT 3003 is the region represented by 3004 which overlaps a drain line 3040 of the current control TFT 3003 with an insulation film interposed therebetween. At this time, a capacitor is formed in the region represented by 3004. The capacitor 3004 serves as a capacitor to maintain a voltage applied to the gate of the current control TFT 3003. The drain line 3040 is connected to a current supply line (power supply line) 3006 and is always applied with a constant voltage.

A first passivation film 3041 is provided on the switching TFT 3002 and current control TFT 3003, and a planarizing film 3042 constituted by a resin insulation film is formed on the same. It is very much important to planarize any step resulting from the TFTs using the planarizing film 3042. Since an EL layer to be formed later has a very small thickness, the presence of any step can cause an emission failure. It is therefore desirable to perform planarization prior to the formation of a pixel electrode to allow the EL layer to be formed as planar as possible.

3043 represents a pixel electrode (a cathode of the EL element) constituted by a conductive film having high reflectivity which is electrically connected to the drain of the current control TFT 3003. The pixel electrode 3043 is preferably a conductive film having low resistance such as an aluminum alloy film, copper alloy film or silver alloy film or a multi-layer film consisting of such films. Obviously, it may be combined with another conductive film to provide a multi-layer structure.

An emission layer 3045 is formed in a groove (which corresponds to a pixel) defined by banks 3044a and 3044b formed by an insulation film (preferably resin). While only one pixel is illustrated here, emission layers respectively associated with R (red), G (green) and B (blue) colors may be formed separately. A π conjugate polymer-based material may be used as an organic EL material for the emission layer. Typical polymer-based materials include polyparaphenylenevinylene (PPV)-based, polyvinylcarbazole (PVK)-based and polyfluorene-based materials.

While there are various types of PPV-based organic EL materials, for example, materials as disclosed in H. Shenk, H. Becker, O. Gelsen, E. Kluge, W. Kreuder and H. Spreitzer "Polymers for Light Emitting Diodes", Euro Display, Proceedings, 1999, pp. 33-37 and Japanese unexamined patent publication No. H10-92576 may be used.

Referring specifically to the emission layers, cyanopolyphenylenevinylene may be used for the emission layer emitting in red; polyphenylenevinylene may be used for the emission layer emitting in green; and polyphenylenevinylene or polyalkylphenylene may be used for the emission layer emitting in blue. The thickness of the films may be in the range from 30 to 150 nm (or preferably from 40 to 100 nm).

The above-described examples are merely examples of organic EL materials that can be used for the emission layers, and the invention is not limited by them at all. The EL layer (layer to emit light and to allow carrier movement therefor) may be formed by combining an emission layer, a charge transport layer and a charge injection layer freely.

For example, while the present embodiment refers to an example of the use of polymer type materials for the emission layers, low molecular type organic EL materials may be used. Inorganic materials such as silicon carbide may also be used for the charge transport layer and charge injection layer. Known materials may be used as such organic EL materials and inorganic materials.

According to the present embodiment, there is provided an EL layer having a multi-layer structure including a hole injection layer 3046 made of PEDOT (polythiophene) or PAni (polyaniline) provided on the emission layer 3045. An anode 3047 constituted by a transparent conductive film is provided on the hole injection layer 3046. In the present embodiment, since light generated at the emission layer 3045 is emitted toward the upper surface (upward of the TFT), the anode must be transmissible. While a compound of indium oxide and tin oxide or a compound of indium oxide and zinc oxide may be used for the transparent conductive film, a film which can be formed at a lowest possible temperature is preferred because it is formed after the formation of the emission layer and hole injection layer which have low anti-heat properties.

An EL element 3005 is completed when the anode 3047 is formed. The EL element 3005 in this context means a capacitor which is formed by the pixel electrode (cathode) 3043, emission layer 3045, hole injection layer 3046 and anode 3047. Since the pixel electrode 3043 substantially coincides with the area of a pixel as shown in FIG. 15A, the pixel as a whole serves as an EL element. This allows a very high degree of utilization of emission and therefore allows an image to be displayed with high brightness.

According to the present embodiment, a second passivation film 3048 is further provided on the anode 3047. A silicon nitride film or silicon nitride oxide film is preferably used as the second passivation film 3048. The purpose is to isolate the EL element from the outside, which contributes to both of prevention of deterioration attributable to the oxidation of the organic EL material and the suppression of release of gases from the organic EL material. This improves the reliability of the EL display device.

As described above, the EL display panel of the present embodiment has a pixel portion formed by pixels with a structure as shown in FIG. 14, switching TFTs having a sufficiently low off current and current control TFTs which are resistant to hot carriers injected therein. Thus, an EL display panel can be provided which is reliable and capable of displaying preferable images.

Ninth Embodiment

The present embodiment will refer to a structure of the pixel portion shown in the eighth embodiment in which the structure of the EL element 3005 is inverted. The description will be made using FIG. 16. Since the structure is different from the structure in FIGS. 15A and 15B only in the regions of the EL element and current control TFT, the structure will not be described in any other aspect.

Figure 16:
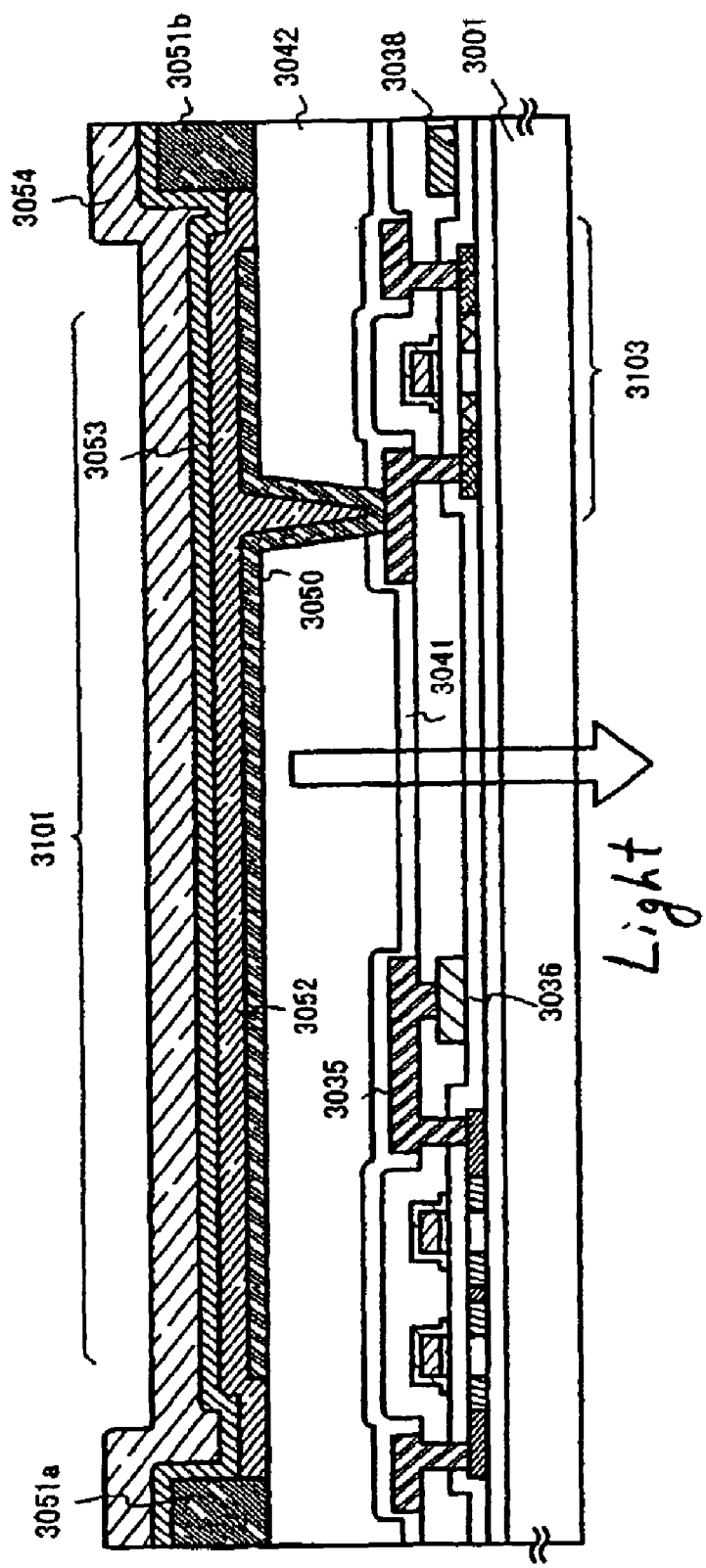
FIG. 16 is a sectional view of an EL display device according to a ninth embodiment of the invention showing a configuration of a pixel portion thereof.

Referring to FIG. 16, a current control TFT 3103 is formed using a P-TFT.

According to the present embodiment, a transparent conductive film is used as a pixel electrode (anode) 3050. Specifically, a conductive film made of a compound of indium oxide and zinc oxide is used. Obviously, a conductive film made of a compound of indium oxide and tin oxide may be used instead.

After forming banks 3051a and 3051b constituted by insulation films, a solution is applied to form an emission layer 3052 made of polyvinylcarbazole. An electron injection layer 3053 made of potassium acetylacetonate and an cathode 3054 made of an aluminum alloy are formed on the same. In this case, the cathode 3054 serves also as a passivation film. An EL element 3101 is thus formed.

According to the present embodiment, as indicated by the arrow, light generated at the emission layer 3052 is emitted toward the substrate on which TFTs are formed.

The configuration of the present embodiment may be implemented in arbitrary combination with any of the configurations according to the first through seventh embodiments. The EL display panel of the present embodiment is advantageously used as a display portion of an electronic apparatus according to the seventh embodiment of the invention.

Tenth Embodiment

Figure 17A:
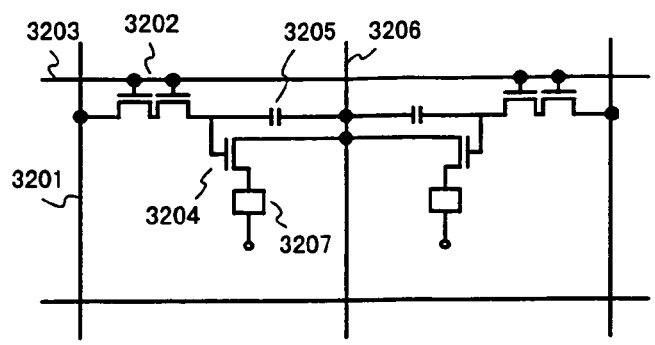
FIGS. 17A, 17B and 17C are circuit diagrams of an EL display device according to a tenth embodiment of the invention showing configurations of a pixel portion thereof.
Figure 17B:
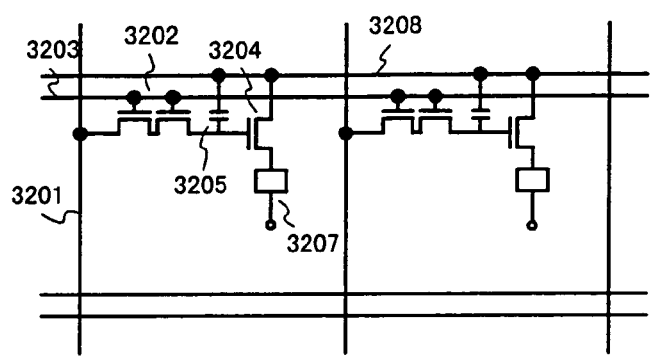
Figure 17C:
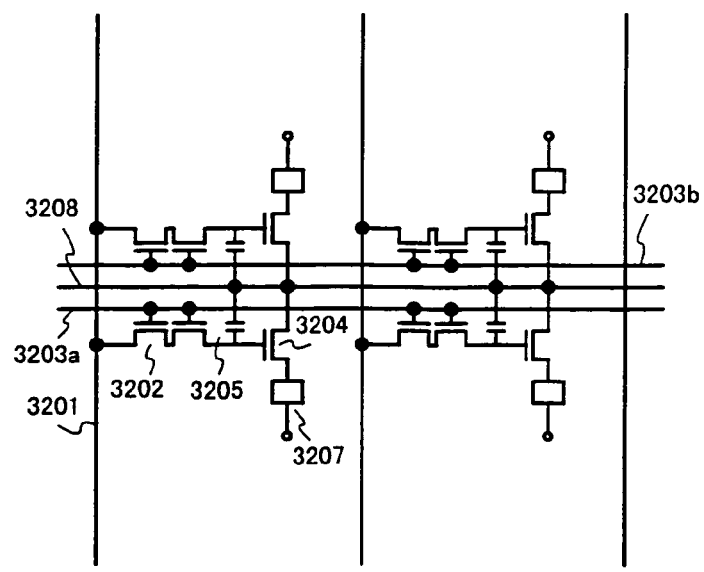

According to the present embodiment, FIGS. 17A, 17B and 17C show examples of pixels having structures different from that shown in the circuit diagram of FIG. 15B. In the present embodiment, 3201 represents a source line of a switching TFT 3202; 3203 represents a gate line of the switching TFT 3202; 3204 represents a current control TFT; 3205 represents a capacitor; 3206 and 3208 represent current supply lines; and 3207 represents an EL element.

FIG. 17A shows an example in which a current supply line 3206 is shared by two pixels. Specifically, the example is characterized in that two pixels are formed line symmetrically about a current supply line 3206. In this case, since the number of current supply lines can be reduced, the pixel portion can be provided with higher fineness.

FIG. 17B shows an example in which current supply lines 3208 are provided in parallel with gate lines 3203. While FIG. 17B shows a structure in which the current supply lines 3208 and gate lines 3203 are provided such that they do not overlap each other, they may be provided in an overlapping relationship with an insulation film interposed if they are lines formed in different layers. In this case, the fineness of the pixel portion can be further improved because current supply lines 3208 and gate lines 3203 can occupy common areas.

FIG. 17C is characterized in that current supply lines 3208 are provided in parallel with gate lines 3203a and 3203b as in the structure in FIG. 17B and in that two pixels are formed line symmetrically about a current supply line 3208. It is also advantageous to provide a current supply line 3208 such that it overlaps either of the relevant gate lines 3203a and 3203b. In this case, the fineness of the pixel portion can be further improved because the number of the current supply lines can be reduced.

Eleventh Embodiment

While FIGS. 15A and 15B for to the eighth embodiment show a structure in which a capacitor 3004 is provided to maintain a voltage applied to the gate of a current control TFT 3003, the capacitor 3004 may be deleted. According to the present embodiment, a TFT having an LDD region provided in an overlapping relationship with a gate electrode with a gate insulation film interposed is used as the current control TFT 3003. While a parasitic capacitance generally referred to as "gate capacitance" is formed in the overlapping region, the present embodiment is characterized in that the parasitic capacitance is actively used instead of the capacitor 3004.

Since the parasitic capacitance varies depending on the area of the above-described overlapping region between the gate electrode and LDD region, the capacitance is determined by the length of the LDD region included in the overlapping region.

The capacitor 3205 may be similarly deleted from the structures in FIGS. 17A, 17B and 17C shown in the tenth embodiment.

The present invention makes it possible to provide a magnified image having a high resolution with a view finder. The present invention therefore allows a user of a video camera or a digital camera to check a magnified image by observing a view finder without observing an externally attached liquid crystal panel having a large screen.

Thus, the present invention makes it possible to reduce power consumption of a digital camera or video camera.

What is claimed is:

1. A camera comprising:
   a body of the camera; and
   an electroluminescence display device attached to the body, the electroluminescence display device being configured to project an image to only one eye of a user and comprising:
   a substrate having a first surface and a second surface wherein the second surface is on an opposite side of the substrate with respect to the first surface;
   a thin film transistor formed over the first surface of the substrate;
   a planarizing film formed over the thin film transistor, the planarizing film comprising a resin and having a planarized upper surface so as to reduce a step caused by at least the thin film transistor on a surface of the planarizing film;
   a first electrode formed on the planarizing film and electrically connected to the thin film transistor;
   an emission layer formed over the first electrode;
   a second electrode formed over the emission layer,
   wherein the second surface of the substrate has a single spherical configuration which acts as a single lens.

2. The camera according to claim 1, wherein said emission layer comprises an organic electroluminescence material.

3. The camera according to claim 1, wherein said emission layer comprises an inorganic electroluminescence material.

4. The camera according to claim 1 wherein the camera is a video camera.

5. The camera according to claim 1 wherein the camera is a digital camera.

6. A camera comprising:
   a body of the camera; and
   an electroluminescence display device attached to the body, the electroluminescence display device being configured to project an image to only one eye of a user and comprising:
   a substrate having a first surface and a second surface wherein the second surface is on an opposite side of the substrate with respect to the first surface;
   a thin film transistor formed over the first surface of the substrate, said thin film transistor comprising an LDD region and a gate electrode partly overlapping the LDD region;
   a planarizing film formed over the thin film transistor, the planarizing film comprising a resin and having a planarized upper surface so as to reduce a step caused by at least the thin film transistor on a surface of the planarizing film;
   a first electrode formed on the planarizing film and electrically connected to the thin film transistor;
   an emission layer formed over the first electrode;
   a second electrode formed over the emission layer,
   wherein the second surface of the substrate has a single spherical configuration which acts as a single lens.

7. The camera according to claim 6, wherein said emission layer comprises an organic electroluminescence material.

8. The camera according to claim 6, wherein said emission layer comprises an inorganic electroluminescence material.

9. The camera according to claim 6 wherein the camera is a video camera.

10. The camera according to claim 6 wherein the camera is a digital camera.

11. A camera comprising:
    a body of the camera; and
    a view finder for only one eye of a user, the viewfinder including an electroluminescence display device attached to the body, the electroluminescence display device comprising:
    a substrate having a first surface and a second surface wherein the second surface is on an opposite side of the substrate with respect to the first surface;
    a thin film transistor formed over the first surface of the substrate;
    a planarizing film formed over the thin film transistor, the planarizing film comprising a resin and having a planarized upper surface so as to reduce a step caused by at least the thin film transistor on a surface of the planarizing film;
    a first electrode formed on the planarizing film and electrically connected to the thin film transistor;
    an emission layer formed over the first electrode;
    a second electrode formed over the emission layer,
    wherein the second surface of the substrate has a single spherical configuration which acts as a single lens.

12. The camera according to claim 11, wherein said emission layer comprises an organic electroluminescence material.

13. The camera according to claim 11, wherein said emission layer comprises an inorganic electroluminescence material.

14. The camera according to claim 11 wherein the camera is a video camera.

15. The camera according to claim 11 wherein the camera is a digital camera.

16. A camera comprising:
    a body of the camera; and
    a view finder for only one eye of a user, the viewfinder including an electroluminescence display device attached to the body, the electroluminescence display device comprising:
    a substrate having a first surface and a second surface wherein the second surface is on an opposite side of the substrate with respect to the first surface;
    a thin film transistor formed over the first surface of the substrate, said thin film transistor comprising an LDD region and a gate electrode partly overlapping the LDD region;
    a planarizing film formed over the thin film transistor, the planarizing film comprising a resin and having a planarized upper surface so as to reduce a step caused by at least the thin film transistor on a surface of the planarizing film;
    a first electrode formed on the planarizing film and electrically connected to the thin film transistor;
    an emission layer formed over the first electrode;
    a second electrode formed over the emission layer,
    wherein the second surface of the substrate has a single spherical configuration which acts as a single lens.

17. The camera according to claim 16, wherein said emission layer comprises an organic electroluminescence material.

18. The camera according to claim 16, wherein said emission layer comprises an inorganic electroluminescence material.

19. The camera according to claim 16 wherein the camera is a video camera.

20. The camera according to claim 16 wherein the camera is a digital camera.

* * * * *